(12) United States Patent
Sasaki et al.

(10) Patent No.: US 8,450,843 B2
(45) Date of Patent: May 28, 2013

(54) SEMICONDUCTOR DEVICE AND METHOD FOR DESIGNING THE SAME

(75) Inventors: Hideki Sasaki, Tokyo (JP); Daisuke Ohshima, Tokyo (JP); Takuo Funaya, Tokyo (JP)

(73) Assignee: NEC Corporation, Tokyo (JP)

( * ) Notice: Subject to any disclaimer, the term of this patent is extended or adjusted under 35 U.S.C. 154(b) by 47 days.

(21) Appl. No.: 12/682,369

(22) PCT Filed: Oct. 14, 2008

(86) PCT No.: PCT/JP2008/068549
§ 371 (c)(1),
(2), (4) Date: Jun. 9, 2010

(87) PCT Pub. No.: WO2009/048154
PCT Pub. Date: Apr. 16, 2009

(65) Prior Publication Data
US 2010/0237492 A1    Sep. 23, 2010

(30) Foreign Application Priority Data

Oct. 12, 2007  (JP) .................... 2007-266980

(51) Int. Cl.
*H01L 23/04*  (2006.01)
*H01L 21/00*  (2006.01)

(52) U.S. Cl.
USPC ........... 257/698; 257/691; 257/700; 257/703; 257/778; 257/E23.067; 257/E23.079; 257/E23.175

(58) Field of Classification Search
USPC ................ 257/691, 700–703, 690, 692, 711, 257/E23.175, 693, 698, 778
See application file for complete search history.

(56) References Cited

U.S. PATENT DOCUMENTS

| | | | |
|---|---|---|---|
| 6,359,341 B1 * | 3/2002 | Huang et al. | 257/778 |
| 2004/0070948 A1 * | 4/2004 | Kao et al. | 361/717 |
| 2004/0080044 A1 * | 4/2004 | Moriyama et al. | 257/728 |

FOREIGN PATENT DOCUMENTS

| | | |
|---|---|---|
| JP | 5-82710 A | 4/1993 |
| JP | 8-78573 A | 3/1996 |
| JP | 10-209325 A | 8/1998 |
| JP | 2001237275 A | 8/2001 |
| JP | 2003046019 A | 2/2003 |
| JP | 2003309243 A | 10/2003 |
| JP | 2005228901 A | 8/2005 |

OTHER PUBLICATIONS

International Search Report for PCT/JP2008/068549 mailed Jan. 6, 2009.

\* cited by examiner

*Primary Examiner* — Jasmine Clark

(57) ABSTRACT

The semiconductor device comprises a semiconductor chip and a printed wiring board having a recess in which the semiconductor chip is housed face-down, wherein the printed wiring board comprises multiple wiring layers below a circuit surface of the semiconductor chip on which connection terminals are formed, and the multiple wiring layers include a first wiring layer for forming signal wires, a second wiring layer for forming a ground plane, and a third wiring layer for forming power wires and power BGA and ground BGA pads in sequence from the circuit surface.

11 Claims, 14 Drawing Sheets

SEMICONDUCTOR DEVICE AND METHOD FOR DESIGNING THE SAME

The present invention the National Phase of PCT/JP2008/068549, filed Oct. 14, 2008, which claims the benefit of Japanese Patent Application No. 2007-266980, filed on Oct. 12, 2007, the entire disclosure of which is incorporated by reference herein.

TECHNICAL FIELD

The present invention relates to a semiconductor device and a method for designing the semiconductor device and particularly to a semiconductor device having a printed wiring board in which a semiconductor chip is embedded face-down and a method for designing the semiconductor device.

BACKGROUND ART

Prior art semiconductor devices have a semiconductor chip mounted on a printed wiring board and generally employ a wire bonding connection with which the terminals on the semiconductor chip and the terminals on the printed wiring board are connected by bonding wires or a flip chip connection with which Au or solder bumps are formed on the terminals on the semiconductor chip and the bumps and the terminals on the printed wiring board are connected.

In addition to the above structure, semiconductor devices using a printed wiring board in which a semiconductor chip is embedded face-down, namely with the surface of the the semiconductor chip on which the connection terminals are formed (the circuit surface) facing down, have been proposed. Patent Literature 1 and Prior Application 1 (Patent Application No. 2006-300681) describe a semiconductor device in which a semiconductor chip is embedded in a printed wiring board and the wiring layers are formed on the semiconductor chip circuit surface side. Patent Literature 2 and Prior Application 2 (Patent Application No. 2007-093083) describe a semiconductor device in which a semiconductor chip is also embedded in a printed wiring board and the wiring layers are formed on both sides of the semiconductor chip, namely on the circuit surface side and on the rear surface side where no connection terminal is formed.

In the above semiconductor devices, an assembly process involving wire bonding or flip chip connection is unnecessary. The connection terminals of the semiconductor chip can be connected to the terminals on the printed wiring board in the printed wiring board production process. Therefore, reduction in assembly cost is highly expected.

Furthermore, the aforementioned printed wiring board can be a built-up board, which allows for wires and vias with fine pitch. Consequently, the printed wiring board can be downsized and the semiconductor device can accordingly be downsized. In addition, there is an expectation of application to semiconductor chips having more pins with a finer pitch than the semiconductor devices produced by a flip chip connection.

Although a built-up board allows for finer wires, the wiring layers must be formed one by one. It is known that the yield drops by a factor of the factorial of the number of layers as the number of layers is increased. Therefore, manufacturing quality is not ensured in the production of semiconductor devices having a printed wiring board in which a semiconductor chip is embedded unless the product has a small number of layers.

Meanwhile, some semiconductor chips have an area terminal consisting of terminals arranged in a matrix on the circuit surface and some have a peripheral terminal consisting of terminals arranged in a row on the circuit surface. For producing a semiconductor device using a semiconductor chip with an area terminal, a specific number of layers corresponding to the number of matrixes are necessary for pulling out all wires in the printed wiring board. Therefore, a multilayer printed wiring board having four or more layers is generally used. Furthermore, the above semiconductor device is produced by connecting a semiconductor chip having an area terminal to a multilayer printed wiring board by means of a flip-chip connection. The terminals arranged in a matrix cannot be connected to terminals arranged in one or two rows on a printed wiring board one by one by wire bonding.

Problems with embedding the above semiconductor chip having an area terminal in a multilayer printed wiring board include the fact that the number of built-up layers is increased, yield drops, and manufacturing quality is not ensured when the multilayer printed wiring board has four or more layers, as in the prior art.

Patent Literature 1 and 2 and Prior Applications 1 and 2 disclose the structures for embedding a semiconductor chip in a printed wiring board and the methods for producing them. However, there is no disclosure regarding the specific design of wiring patterns such as specific assignment of wiring layers to signal wires, power wires or a power plane, or ground wires or a ground plane and assignment schemes for reducing the number of layers.

Patent Literature 3 describes a semiconductor device in which a semiconductor chip having a peripheral terminal is embedded in a printed wiring board and the layer structure is designed to reduce the number of layers of the printed wiring board.

Patent Literature 1: Unexamined Japanese Patent Application KOKAI Publication No. 2003-46019;
Patent Literature 2: Unexamined Japanese Patent Application KOKAI Publication No. 2003-309243; and
Patent Literature 3: Unexamined Japanese Patent Application KOKAI Publication No. 2005-228901.

DISCLOSURE OF INVENTION

The inventors of the present invention initially considered the layer structure disclosed in Patent Literature 3 useful for embedding a semiconductor chip having an area terminal in a printed wiring board face-down and investigated the wiring pattern design. However, it was found to be unrealizable for the following reason.

FIG. 28 is a cross-sectional view of a presumable semiconductor device in which a semiconductor chip having an area terminal is embedded in a printed wiring board disclosed in Patent Literature 3 face-down. The printed wiring board of Patent Literature 3 has a six-layer structure including, from the top, first and second layers that are signal layers (S), a third layer that is a ground plane layer (G), a fourth layer that is a power plane layer (V), and fifth and sixth layers that are signal layers (S). Furthermore, the semiconductor chip is connected to the fifth, signal layer by flip chip connection. Therefore, the semiconductor chip penetrates the fourth layer. A semiconductor device 100B shown in FIG. 28 comprises a semiconductor chip 1D having an area terminal, a printed wiring board 10B, and another semiconductor chip 1E mounted on the printed wiring board 10B. In the layer structure of the printed wiring board 10B, the fourth, power plane layer and third, ground plane layer from the top are situated above the circuit surface on the semiconductor chip 1D. Therefore, as shown in the figure, the power terminals and ground terminals of the semiconductor chip 1D have to be once pulled out from the semiconductor chip 1D to connect them to the plane layers.

As described in Patent Literature 3, it is possible to pull out the power terminals and ground terminals of a semiconductor chip having a peripheral terminal and connect them to the fourth, power plane layer and third, ground plane layer, respectively as long as the fifth and sixth, signal layers are provided. However, when the semiconductor chip 1D having an area terminal is embedded in the printed wiring board 10B face-down as shown in FIG. 28, a power terminal 3a and a ground terminal 3b near the center of the semiconductor chip 1D cannot be pulled out all by the fifth and sixth layers.

They can be pulled out using fine wires with effort. However, the power or ground impedance may be increased and the power quality may be deteriorated.

The purpose of the present invention is to provide a semiconductor device having a printed wiring board with a smaller number of layers in which a semiconductor chip having an area terminal is embedded face-down for ensured manufacturing quality and a method for designing the semiconductor device.

The present invention provides a semiconductor device comprising a semiconductor chip and a printed wiring board having a recess in which the semiconductor chip is housed face-down, wherein the printed wiring board comprises multiple wiring layers below a circuit surface of the semiconductor chip on which the connection terminals are formed, and the multiple wiring layers include a first wiring layer for forming signal wires, a second wiring layer for forming a ground plane, and a third wiring layer for forming power wires and power BGA pads and ground BGA pads in sequence from the circuit surface.

The present invention further provides a method for designing the above semiconductor device wherein the number of wires running between two adjacent bumps or lands in the first wiring layer and the connection terminal pitch of the semiconductor chip are determined based on the diameter of bumps or lands connected to the semiconductor chip, diameter of bumps or lands connected to the second and third wiring layers, minimum pitch of the first wiring layer, and minimum pitch of the second and third wiring layers.

EFFECT ON THE INVENTION

The semiconductor device according to the present invention has a wiring layer consisting of three layers, a first wiring layer, a second wiring layer, and a third wiring layer, from the circuit surface of the semiconductor chip on which the connection terminals are formed; a smaller number of layers and no dropping in the yield ensure the manufacturing quality.

The method for designing the semiconductor device according to the present invention allows for designing of a printed wiring board free from short-circuit failure in high density wiring design, ensuring the semiconductor device manufacturing quality.

The above and other purpose, characteristics, and benefits of the present invention will be apparent from the explanation below with reference to the drawings.

BEST MODE FOR CARRYING OUT THE INVENTION

Embodiments of the present invention will be described in detail hereafter with reference to the drawings. For easy understanding, the same components are referred to by the same reference numbers throughout the figures. Lands and bumps are collectively termed lands in the following description.

First Embodiment

Figure 1:
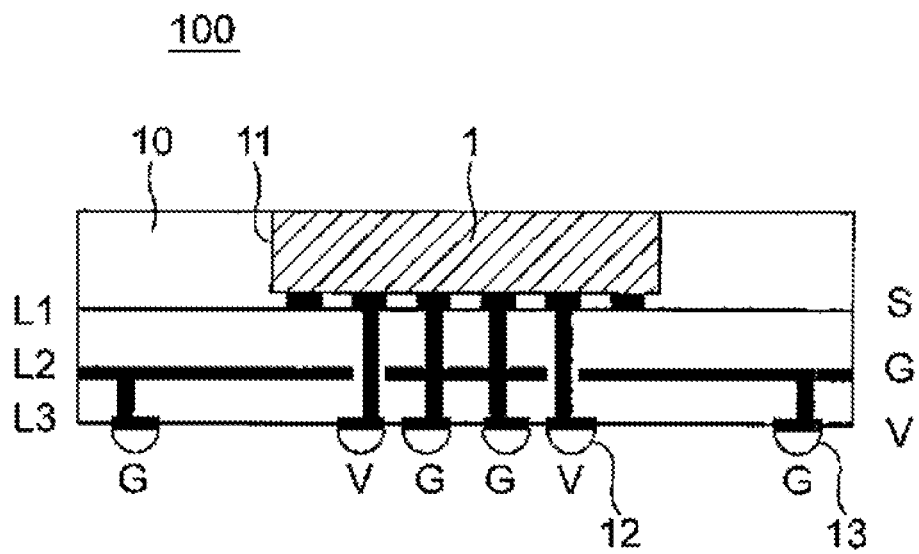
FIG. 1 is a cross-sectional view of the semiconductor device according to the first embodiment of the present invention.
Figure 2:
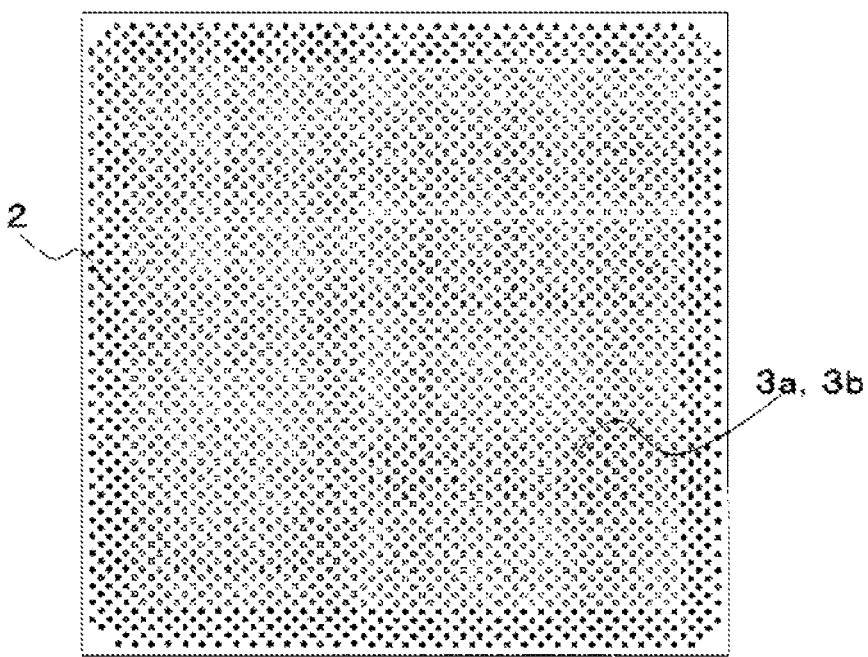
FIG. 2 is an illustration showing a layout of connection terminals of a semiconductor chip.

FIG. 1 is a cross-sectional view of the semiconductor device according to the first embodiment of the present invention. A semiconductor device 100 comprises a semiconductor chip 1 and a printed wiring board 10 in which the semiconductor chip 1 is embedded face-down. The semiconductor chip 1 has an area terminal consisting of terminals arranged in a matrix on the surface (the circuit surface). As shown in FIG. 2, signal wire terminals 2 are arranged outside power terminals 3a and ground terminals 3b.

The printed wiring board 10 has a recess 11 in which the semiconductor chip 1 is housed face-down. Below the circuit surface of the semiconductor chip 1 on which the terminals 2, 3a and 3b are formed, a first wiring layer L1, a second wiring layer L2, and a third wiring layer L3 are formed in sequence from the circuit surface via insulating layers. The first wiring layer L1 mainly carries signals wires (S). The second wiring layer L2 carries a ground plane (G) that covers nearly the entire surface of the printed wiring board 10. The third wiring layer L3 mainly carries power wires (V), power BGA pads 12, and ground BGA pads 13.

The signal wires (S) formed in the first wiring layer L1 are connected to the second wiring layer L2 and the third wiring layer L3 via not-shown vias and further connected to signal BGA pads formed in the third wiring layer L3. The ground terminals 3b of the semiconductor chip 1 are connected through vias between the first and second wiring layers L1 and L2 and further connected to the ground BGA pads 13 in the third wiring layer L3 through vias between the second and third wiring layers L2 and L3.

Figure 3:
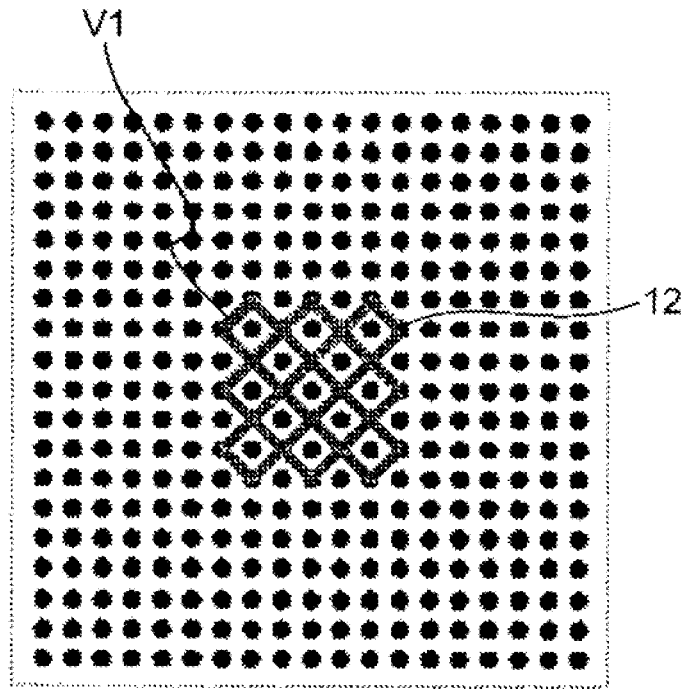
FIG. 3 is an illustration showing a layout of power wires and power BGA pads in the third wiring layer when one type of power source is used.
Figure 4:
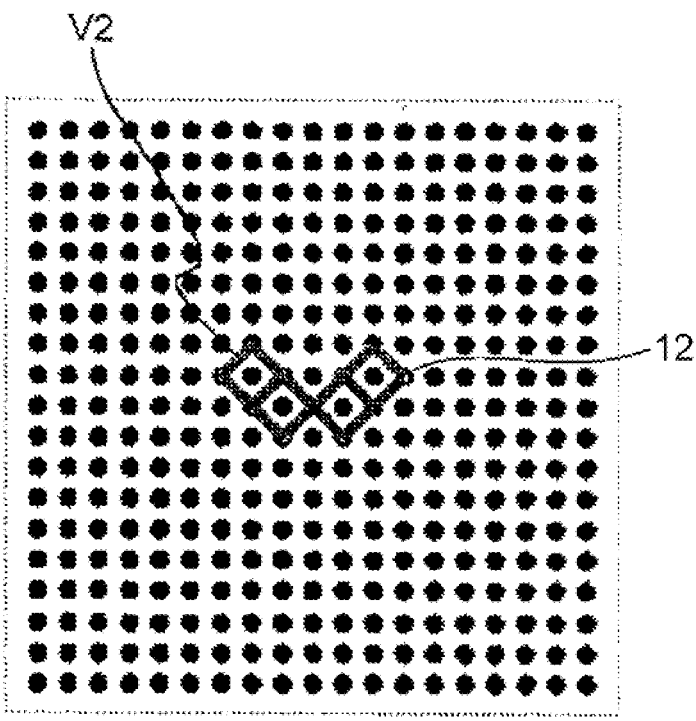
FIG. 4 is an illustration showing another layout of power wires and power BGA pads in the third wiring layer when one type of power source is used.
Figure 5:
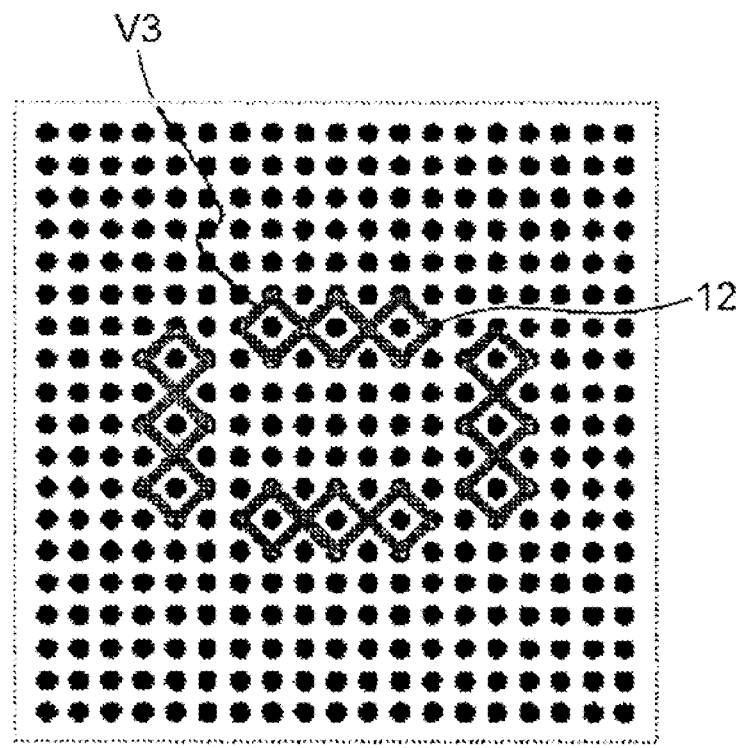
FIG. 5 is an illustration showing a layout of power wires and power BGA pads in the third wiring layer when four types of power sources are used.

FIGS. 3 to 5 show the layouts of the power wires (V) and power BGA pads 12 in the third wiring layer L3. One type of power source is used in FIGS. 3 and 4 and four types of power sources are used in FIG. 5, by way of example. As shown in FIGS. 3 to 5, the power BGA pads 12 are provided on diagonal lines and connected to each other by power wires V1 to V3 in a mesh pattern so as to reduce the power impedance within the printed wiring board plane.

The power terminals 3a of the semiconductor chip 1 are connected to the mesh of power wires V1 to V3 through vias between the first and second wiring layers L1 and L2 and via between the second and third wiring layers L2 and L3, whereby the power terminals 3a of the semiconductor chip 1 are connected to the power BGA pads 12 by short wires through the thickness of the printed wiring board 10.

A method for designing the semiconductor 100 according to this embodiment will be described hereafter. For embedding the semiconductor chip 1 having many pins with small pitches as shown in FIG. 2 in the printed wiring board 10 having the above three-layer structure including the first to third wiring layers L1 to L3, it is necessary to determine the terminal pitches of the semiconductor chip 1 and the number of wires running between two adjacent lands in the first wiring layer L1 and connected to the terminals 2, 3a, and 3b of the semiconductor chip 1 so as to prevent short-circuit failure between wires or between wires and lands in high density wiring design. In the present invention, they are determined in consideration of the minimum line and space ("L/S" hereafter) of the first wiring layer L1 in contact with the circuit surface of the semiconductor chip, the minimum L/S of the middle, second layer L2 and outermost, third wiring layer L3, the diameter of lands (or bumps) in the first wiring layer L1, and the land diameter of vias connected to the second wiring layer L2. Particularly, the land layout in the first wiring layer L1 is the most important in the above design method.

Figure 6:
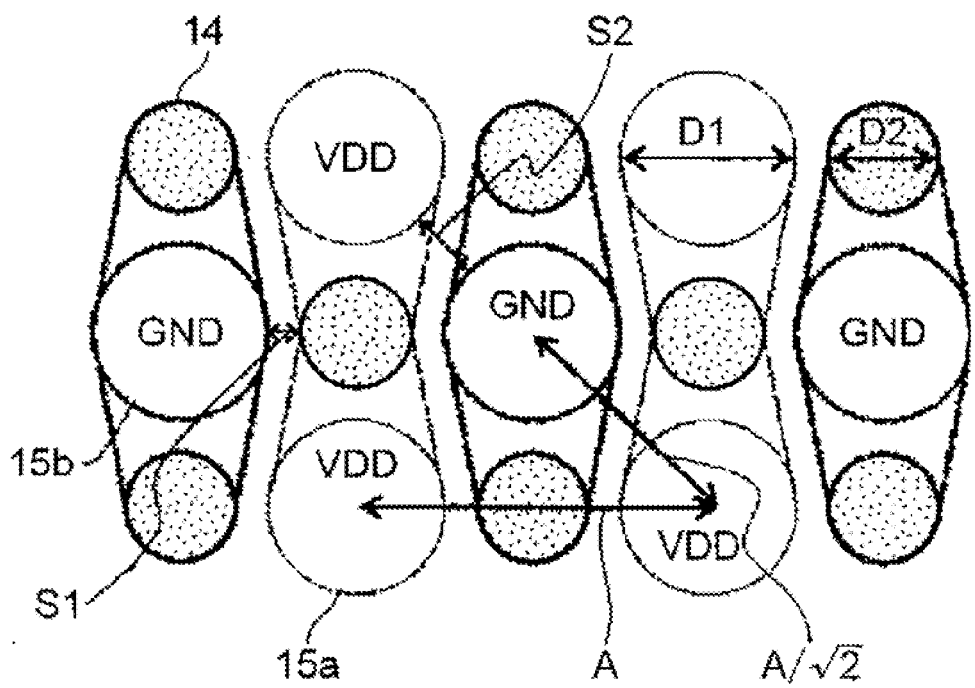
FIG. 6 is an illustration showing a part of the land layout in the first wiring layer L1.

FIG. 6 shows a part of the land layout in the first wiring layer L1. In the figure, lands serving as posts for connection between the terminals of the semiconductor chip 1 and the first wiring layer L1 ("post lands" hereafter) 14 are presented by small circles. Lands serving as vias for connection between the first and second wiring layers L1 and L2 ("via lands" hereafter) are presented by large circles 15a and 15b. Via lands 15a for the power VDD and via lands 15b for the ground GND are arranged in alternate horizontal rows. The post lands 14 are arranged in a zigzag pattern, not in a lattice pattern. Two adjacent post lands 14 are situated on either side of a via land 15a or 15b.

Here, a short-circuit most likely occurs in a space S1, namely the space between a post land 14 and a via land 15a or 15b. Assuming that the via lands 15a and 15b have a diameter D1, the post lands 14 have a diameter D2, and the distance between adjacent vias on Cartesian coordinates is A, the following equation is obtained.

[Math 1]
$$S1 = \frac{A - (D1 + D2)}{2} \quad (1)$$

Figure 7:
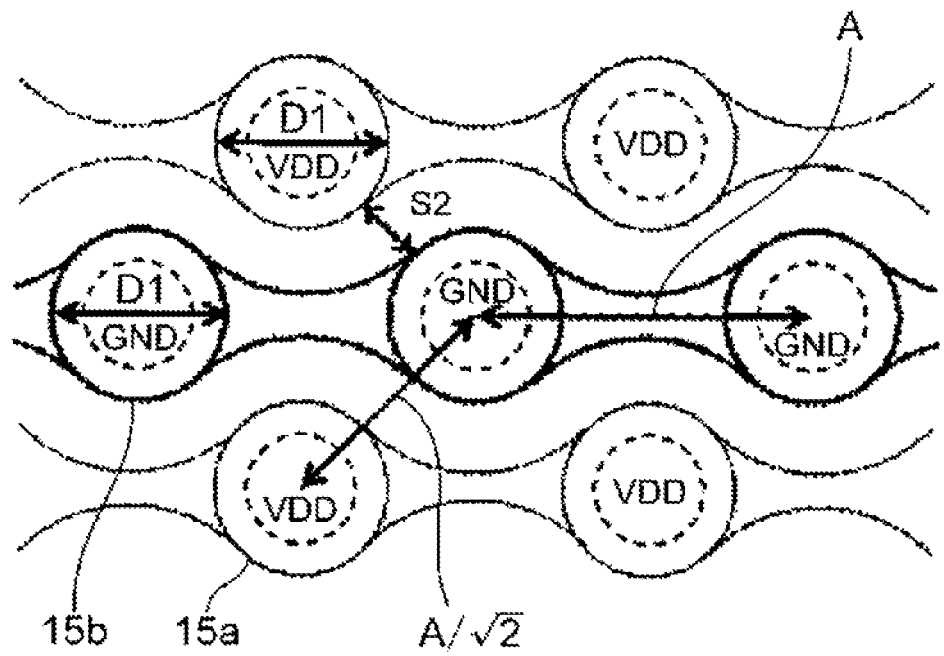
FIG. 7 is an illustration showing the land layout directly below the land shown in FIG. 6.

FIG. 7 shows the land layout directly below the lands shown in FIG. 6. Here, via lands 15a for the power VDD and via lands 15b for the ground GND are connected by horizontally extending wires, respectively. The via lands 15a and via lands 15 are staggered by half. Here, a short-circuit failure likely occurs in a space S2, namely the space between a via land 15a for the power VDD and a via land 15b for the ground GND on a diagonal line. The space S2 can be presented by the following equation using the above A and D1.

[Math 2]
$$S2 = A\sqrt{2} - D1 \quad (2)$$

For example, when A=280 μm, D1=160 μm, and D2=80 μm, S1=20 μm and S2=38 μm are obtained using the above equations 1 and 2: This means that the space in the second wiring layer L2 should be larger than the space in the first wiring layer L1.

Alternatively, when A=320 μm, D1=160 μm, and D2=80 μm, S1=40 μm and S2=66.3 μm are obtained using the above equations 1 and 2. This indicates that the spaces S1 and S2 do not have a proportional relationship but the space in the second wiring layer L2 should still be larger than the space in the first wiring layer L1. Then, it is understood that the spaces S1 and S2, namely the insulating distances between patterns should be checked using the equations 1 and 2 before the values of the above A, D1, and D2 are determined in wiring design.

Under the above conditions, D1 is larger than D2 because the L/S of the first wiring layer L1 is smaller than the L/S of the second wiring layer L2. In this way, only the first wiring layer L1 has a smaller L/S and the second and third wiring layers L2 and L3 can have a moderate L/S in the printed wiring board 10.

How to determine the number of wires running between two adjacent post lands 14 will be described hereafter. Assuming that the number of wires running between post lands 14 is n and the minimum wire width is L, the following equation 3 is derived using the above A and D2.

[Math 3]

$$L = \frac{A - D2}{2n + 1} \quad (3)$$

Figure 8:
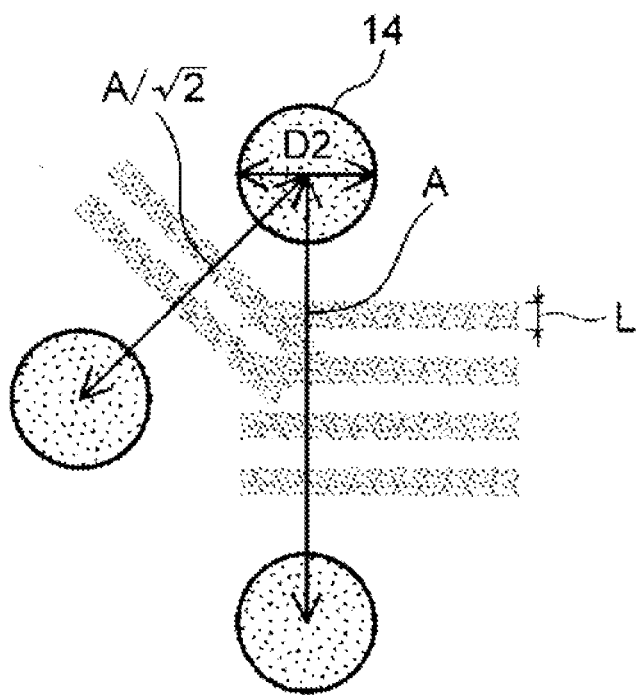
FIG. 8 is an illustration showing the minimum wire width L when the number of wires running between post lands is four (n=4)
Figure 9:
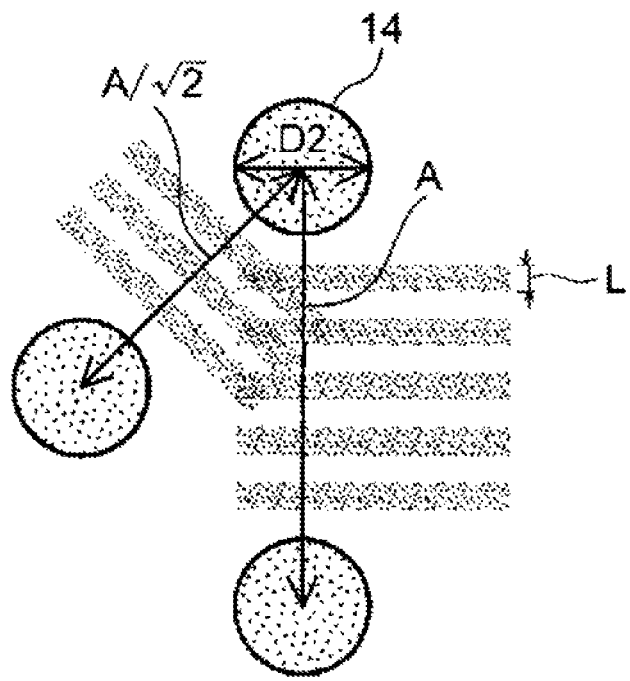
FIG. 9 is an illustration showing the minimum wire width L when the number of wires running between post lands is five (n=5)

For example, when A=280 μm, D2=80 μm, and n=4, the minimum wire width is 22.2 μm. As shown in FIG. 8, when A=320 μm, D2=80 μm, and n=4, the minimum wire width is 60 μm. Furthermore, as shown in FIG. 9, the minimum wire width is 21.8 μm under the same conditions except for n=5. In other words, these conditions are satisfied when the minimum wire width is 20 μm.

In the case wherein n=4, the signal wires can be pulled out by a single wiring layer if the signal wires are assigned to the outer five rows of the area terminal of the semiconductor chip 1. More specifically, in the semiconductor chip 1 shown in FIG. 2, the signal wires can be pulled out only in the first wiring layer L1, provided that the above conditions are satisfied. In the case wherein n=5, the signal wires can be pulled out by a single wiring layer if the signal wires are assigned to the outer six rows. In this embodiment, the first wiring layer L1 serves as the signal wiring layer as described above. It is understood that the signals are assigned to the outer n+1 rows of the area terminal and the L/S is designed to run n signal wires between post lands 14 in order to pull out the signal wires only in the first wiring layer L1.

The semiconductor device 100 free from short-circuit failure between wires or between wires and lands in high density wiring design and ensuring the manufacturing quality can be realized by satisfying the above conditions.

Figure 10:
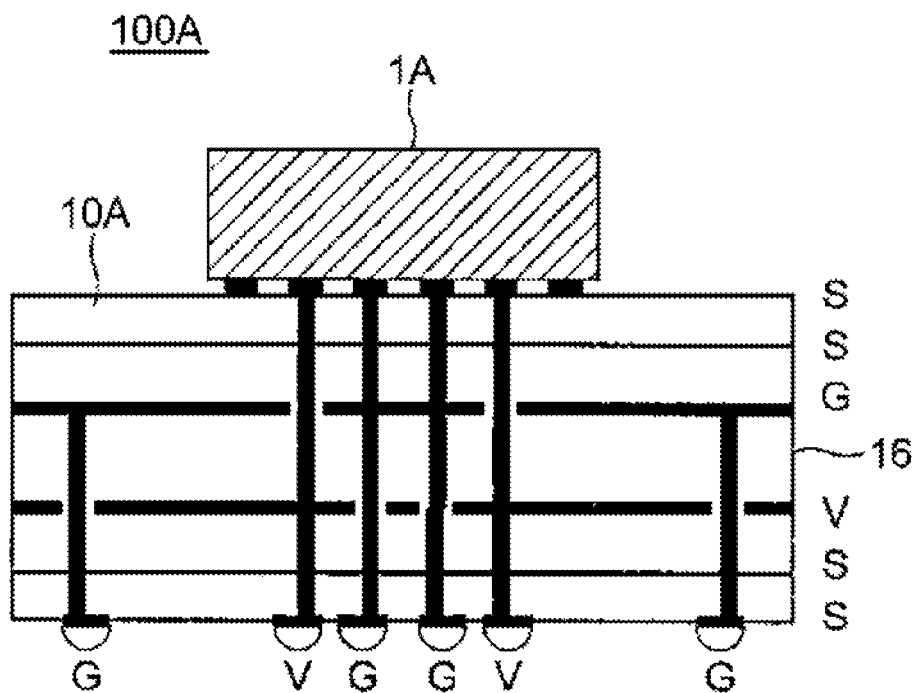
FIG. 10 is a cross-sectional view of a semiconductor device of Comparative Embodiment.

FIG. 10 is a cross-sectional view of the semiconductor device according to a comparative embodiment. A semiconductor device 100A comprises a semiconductor chip 1A having an area terminal and a printed wiring board 10A. The printed wiring board 10A can be a built-up board having built-up layers on either side of a thick core layer 16. The printed wiring board 10A comprises six layers including a signal layer S, a signal layer S, a ground layer G, a power layer V, a signal layer S, and a signal layer S in sequence from the circuit surface of the semiconductor chip 1A. With the top and bottom layers being eliminated, the printed wiring board 10A may comprise four layers including a signal layer S, a ground layer G, a power layer V, and a signal layer S in sequence.

The semiconductor device 100A has the thick core layer 16; therefore, the wires is longer through the board thickness and the power impedance is increased. Furthermore, a larger number of layers cause the yield to drop and make it difficult to ensure the manufacturing quality.

On the other hand, the printed wiring board 10 of the semiconductor device 100 of this embodiment has the basic structure of the present invention comprising, below the circuit surface of a semiconductor chip on which connection terminals are formed, a first wiring layer L1 for forming signal wires, a second wiring layer L2 for forming a ground plane, and a third wiring layer L3 for forming power wires and power BGA pads and ground BGA pads in sequence from the circuit surface. The semiconductor chip 1 having an area terminal is embedded in the printed wiring board 10 face-down and wired using the three wiring layers L1 to L3. Wire bonding or flip chip connection is unnecessary and the assembly cost can be reduced. Furthermore, a small number of layers allow the printed wiring board 10 to have a small thickness, downsizing the semiconductor device 100.

The yield of built-up boards drops as the number of layers increases and the L/S becomes smaller. In the printed wiring board 10 of this embodiment, only the first wiring layer L1 has a small L/S and the second and third wiring layers L2 and L3 have a moderate L/S, whereby the overall reduction in yield is diminished and the manufacturing quality is ensured.

Since the first and second wiring layers L1 and L2 are adjacent to each other, the signal wires S lie next to a ground plane G. The signal current has a return current path secured, ensuring the signal quality.

The printed wiring board 10 does not have the core layer 16 and consists of only built-up layers. Therefore, the wires are short through the board thickness compared with the prior art. Consequently, low power impedance is ensured. More specifically, the power wires formed in the third layer L3 extend over a small area in a printed wiring board plane and no power plane is provided. Instead, a smaller number of layers contribute to the shorter distance between the power terminals 3a or ground terminals 3b of the semiconductor chip 1 and the power BGA pads 12 or ground BGA pads 13, reducing the power or ground impedance.

Furthermore, in the method for designing the semiconductor device 100 of this embodiment, the number of wires running between two adjacent lands in the first wiring layer L1 is determined in consideration of the minimum L/S of the first to third wiring layers L1 to L3, the diameter of post lands 14 in the first wiring layer L1, and the diameter of via lands 15a and 15b connected to the second wiring layer L2. In this way, short-circuit failure is prevented in high density wiring design and the manufacturing quality of the semiconductor device 10 is ensured.

Second Embodiment

Figure 11:
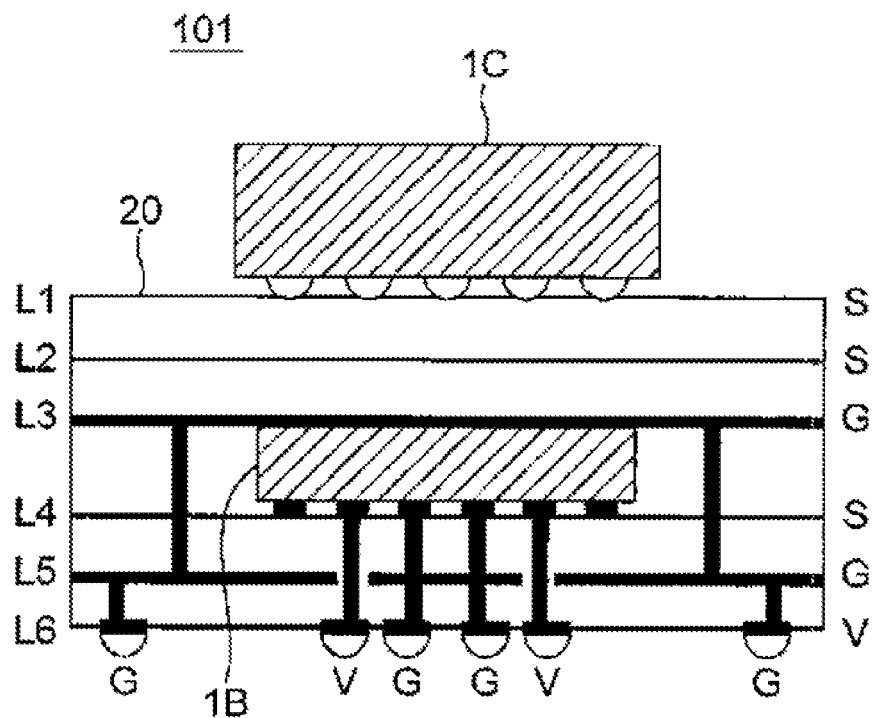
FIG. 11 is a cross-sectional view of the semiconductor device according to the second embodiment of the present invention.

FIG. 11 is a cross-sectional view of the semiconductor device according to the second embodiment of the present invention. A semiconductor device 101 comprises semiconductor chips 1B and 1C and a printed wiring board 20. The printed wiring board 20 has a six-layer structure including wiring layers L1 to L6, three of them are formed on the circuit surface side of the semiconductor chip 1B and the other three are formed on the rear surface side where the semiconductor chip 1B has no terminal. The printed wiring board 20 is different from the printed wiring board 10 of the first embodiment in that the third wiring layer L3 for forming a ground plane G, second wiring layer L2 for forming signal wires S, and farther first wiring layer L1 for forming signal wires S are provided in sequence above the rear surface. Here, the fourth, fifth, and sixth wiring layers L4, L5, and L6 formed on the circuit surface side of the semiconductor chip are the same as the first, second, and third wiring layers L1, L2, and L3 of the printed wiring board 10 of the first embodiment.

In the printed wiring board 20, the third wiring layer L3 constitutes a ground plane G and the signal wires S in the fourth wiring layer L4 are interposed between the third and fifth wiring layers L3 and L5 in each of which the ground plane G is formed.

Furthermore, the fourth wiring layer L4 has the smallest L/S in the printed wiring board 20. It is known that inter-wire crosstalk becomes apparent as the wire intervals is reduced.

In the printed wiring board 20, the ground plane G in the fifth wiring layer L5 serves to reduce crosstalk and the addition of a ground plane G in the third wiring layer L3 contributes to further reduction in crosstalk.

Furthermore, in the semiconductor device 101, another semiconductor chip 1C is provided on the first wiring layer L1. In this case, the ground plane G in the third wiring layer L3 serves as a return current path for the signal wires and power wires connected to the semiconductor chip 1C. In other words, in the semiconductor device 101, the semiconductor chip 1B embedded in the printed wiring board 20 and the other semiconductor chip 1C mounted on the printed wiring board 20 are grounded separately. In this way, stable reference potentials are ensured.

Figure 12:
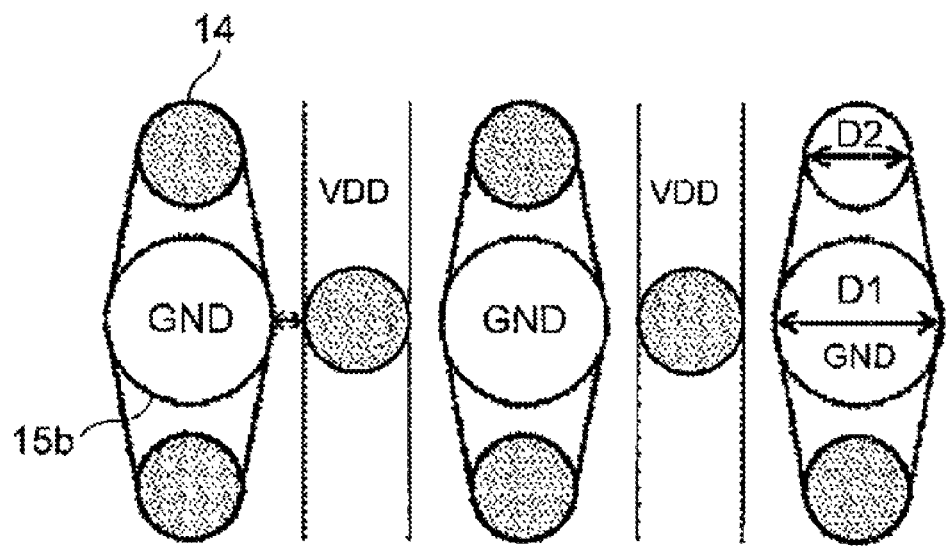
FIG. 12 is an illustration showing another land layout in the first wiring layer.

In the above embodiments, the land layout in the first wiring layer L1 is explained with reference to FIG. 6. The land layout is not restricted thereto. FIG. 12 shows another land layout in the first wiring layer L1. Here, the land layout is designed to reduce the number of minimum spaces for improved manufacturing quality. More specifically, in this land layout, the via lands 15b for the ground GND and the post lands 14 are still close to each other as shown in the figure. However, the via lands 15a for the power VDD in rows directly above and below are made thinner to increase the intervals between the via lands 15b for the ground GND and the power wires compared with the land layout shown in FIG. 6.

Although the number of vias is decreased, the ground wires can be thicker for the absence of upper and lower via land 15a for the power VDD in the land layout shown in FIG. 7. Consequently, this land layout suppresses the increase in power impedance.

Furthermore, in the above embodiments, the semiconductor chip 1 or 1B is embedded in the printed wiring board 10 or 20 face-down and the terminals of the semiconductor chip 1 or 1B make contact with the post lands 14 and via lands 15a and 15b in the first wiring layer L1. This is not restrictive. A thin insulating film can be interposed between the terminals of the semiconductor chip 1 or 1B and the post lands 14 and via lands 15a and 15b.

The present invention will be described in more detail hereafter based on embodiments.

Embodiment 1

Figure 13:
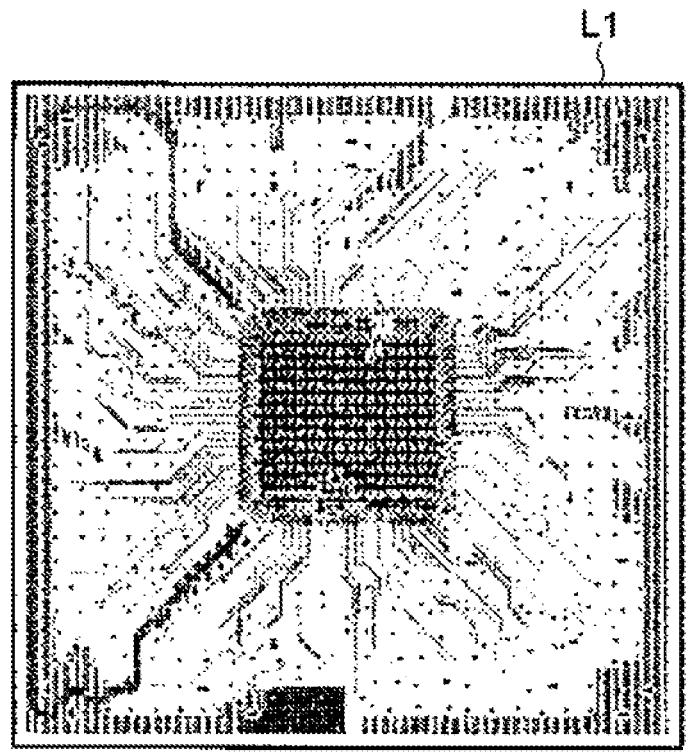
FIG. 13 is an illustration showing the first wiring layer of Embodiment 1.
Figure 14:
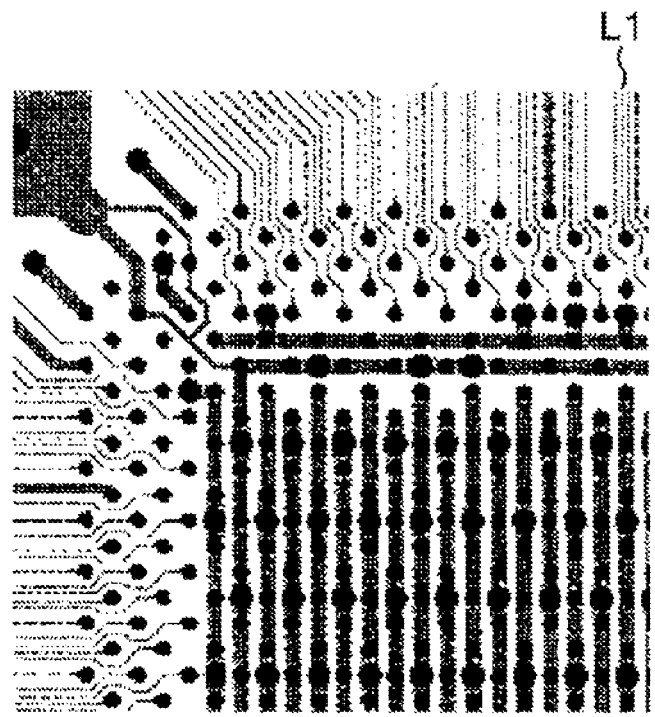
FIG. 14 is an enlarged view of the top left part of the first wiring layer shown in FIG. 13.
Figure 15:
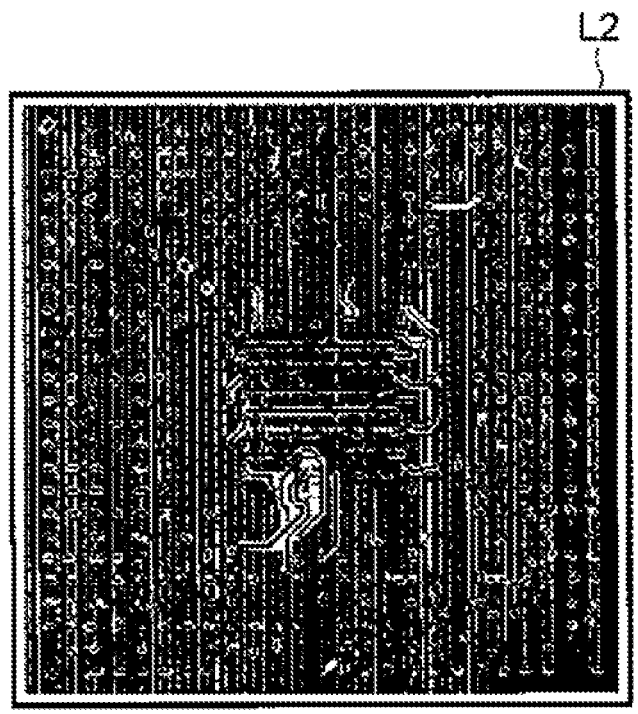
FIG. 15 is an illustration showing the second wiring layer of Embodiment 1.

FIGS. 13 to 17 show the semiconductor device of Embodiment 1 that is produced based on the first embodiment of the present invention. FIG. 13 is a view of the first wiring layer L1, showing that the signal wires in the outer five rows are radially pulled out. FIG. 14 is an enlarged view of the top left part of the first wiring layer L1, showing that the powers and grounds are regularly arranged. FIG. 15 is a view of the second wiring layer L2, showing that a ground plane is formed nearly on the entire surface of the printed wiring board.

Figure 16:
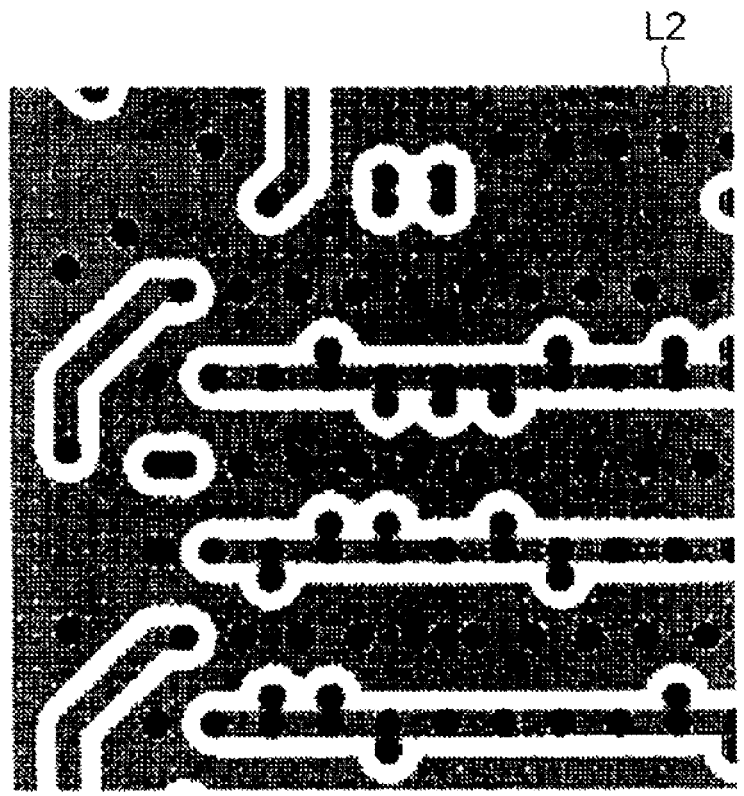
FIG. 16 is an enlarged view of the second wiring layer directly below the first wiring layer shown in FIG. 14.
Figure 17:
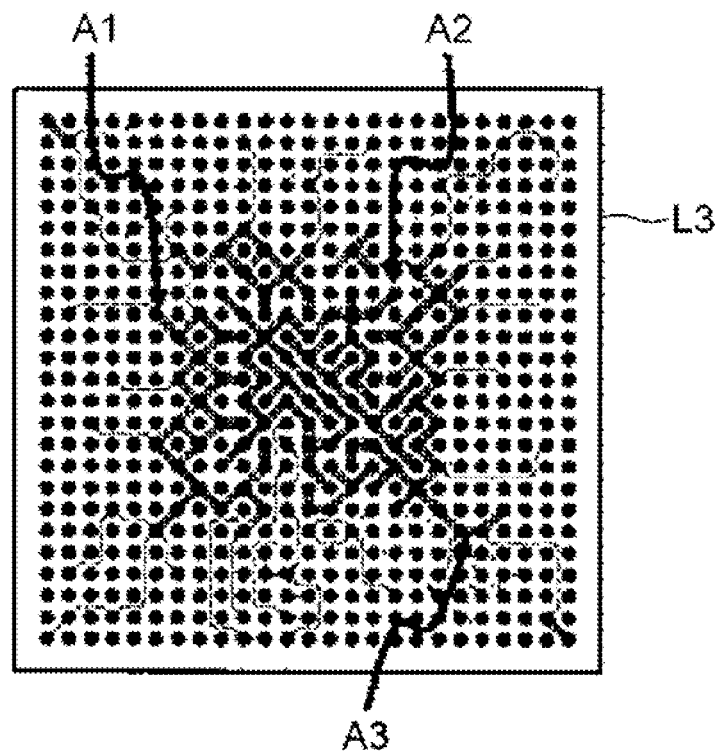
FIG. 17 is an illustration showing the third wiring layer of Embodiment 1.

FIG. 16 is an enlarged view of the second wiring layer L2 directly below the first wiring layer L1 shown in FIG. 14. As described above, since the power vias are made thinner, the thicker ground patterns are formed between the powers. FIG. 17 is a view of the third wiring layer L3. The semiconductor device of this embodiment has three main power regions A1 to A3. In order to realize them using the patterns shown in FIGS. 3 to 5, the layout shown is employed.

Here, the board is 27×27 mm, the chip is 9×9 mm, and the semiconductor chip has approximately 1500 connection terminal pins and 625 BGA pad pins. The first wiring layer L1 has the minimum L/S of 20/20 μm and the second and third wiring layers L2 and L3 have an L/S of 50/50 μm. Furthermore, the via lands have a diameter of 160 μm and the post lands have a diameter of 80 μm.

With the semiconductor chip connection terminal pitch A being 320 μm, the minimum space S1 derived from the above equation 1 is 40 μm and the minimum space S2 derived from the above equation 2 is 66.3 μm; it is confirmed that the design conditions are satisfied. Furthermore, the outer five rows are assigned to signal wires in the semiconductor chip area terminal. The minimum wire width L obtained by the above equation 3 is 26.7 μm; it is confirmed that the L/S condition for the first wiring layer L1 is satisfied.

Embodiment 2

Embodiment 2 produced based on the second embodiment of the present invention so as to have wiring layers on the circuit surface side and on the rear surface side of a semiconductor chip will be described hereafter. Here, the fourth to sixth wiring layers L4 to L6 shown in FIG. 11 are the same as those in FIGS. 13 to 17.

Figure 18:
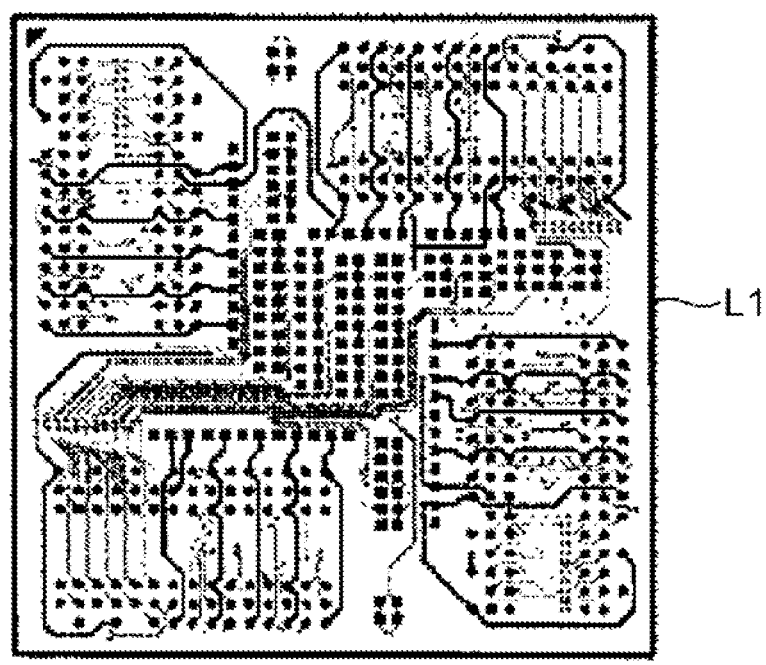
FIG. 18 is an illustration showing the layout of the first wiring layer shown in FIG. 11.
Figure 19:
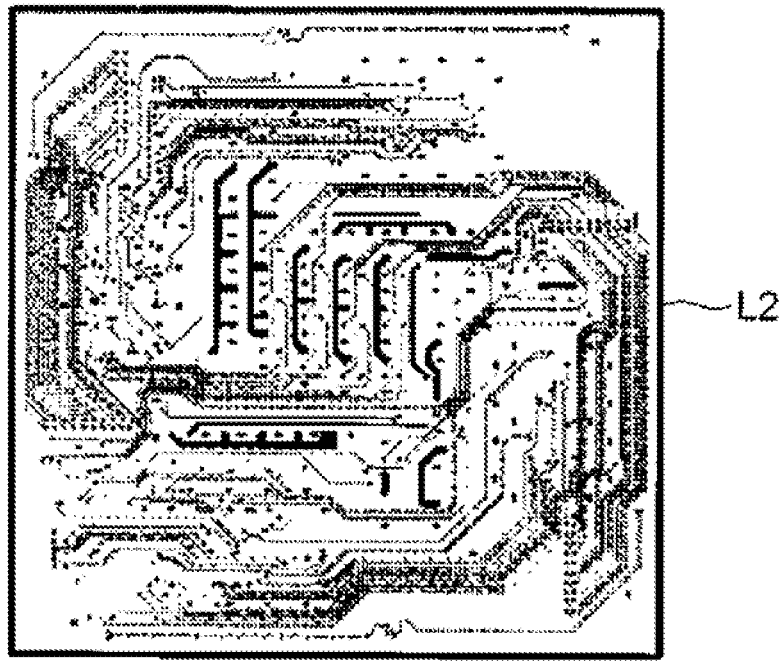
FIG. 19 is an illustration showing the layout of the second wiring layer shown in FIG. 11.
Figure 20:
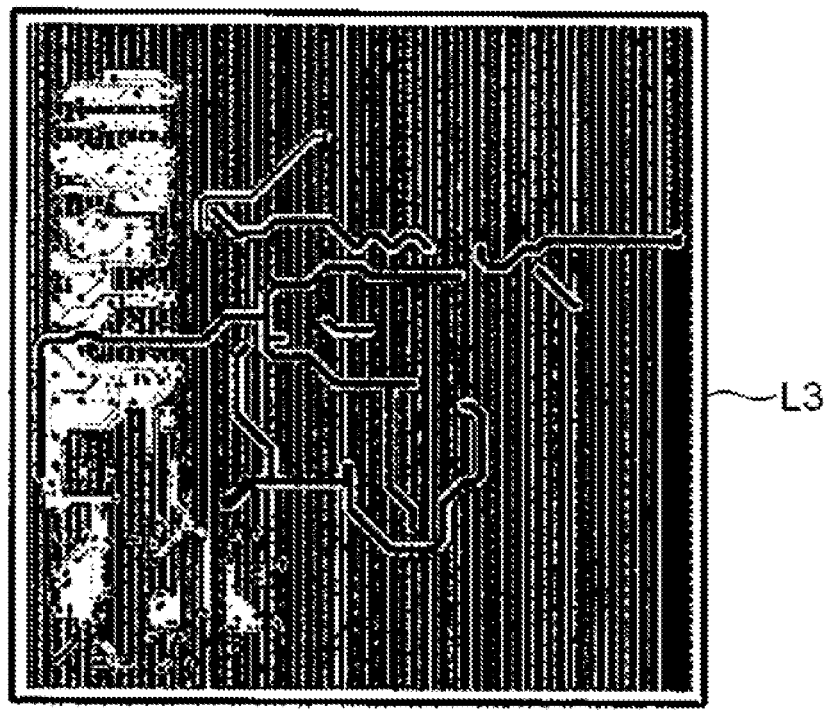
FIG. 20 is an illustration showing the layout of the third wiring layer shown in FIG. 11.

FIG. 18 shows the layout of the first wiring layer L1 shown in FIG. 11. FIG. 19 shows the layout of the second wiring layer L2 shown in FIG. 11. FIG. 20 shows the layout of the third wiring layer L3 shown in FIG. 11. Here, several wires are mixed in the third wiring layer L3. However, it is seen that the third wiring layer L3 mostly consists of a ground plane. In this way, a return current path is secured for the signal wires in the fourth wiring layer L4.

Figure 21:
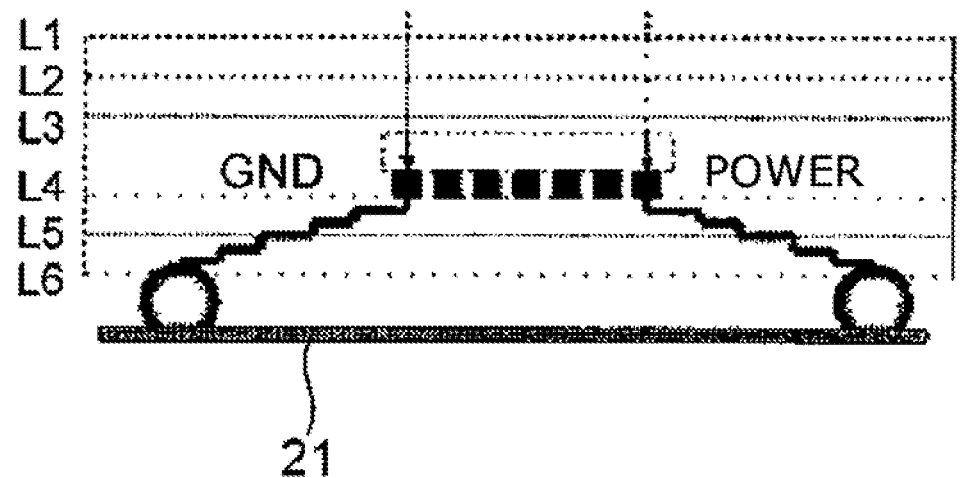
FIG. 21 is an illustration showing the impedance measuring points in the first to sixth layers.

The results of comparison of impedance between Embodiment 2 shown in FIG. 13 to 20 and Comparative Embodiment shown in 10 will be given hereafter. More specifically, power terminals and ground terminals near these power terminals were selected in the three power regions and the power impedance between the semiconductor chip and BGA pads was calculated using an electromagnetic field simulator (SI-WAVE, Ansoft). In FIG. 21, the impedance measuring points in the wiring layers L1 to L6 are marked by arrows and the ground plane for the measurement is marked by a reference number 21.

Figure 22:
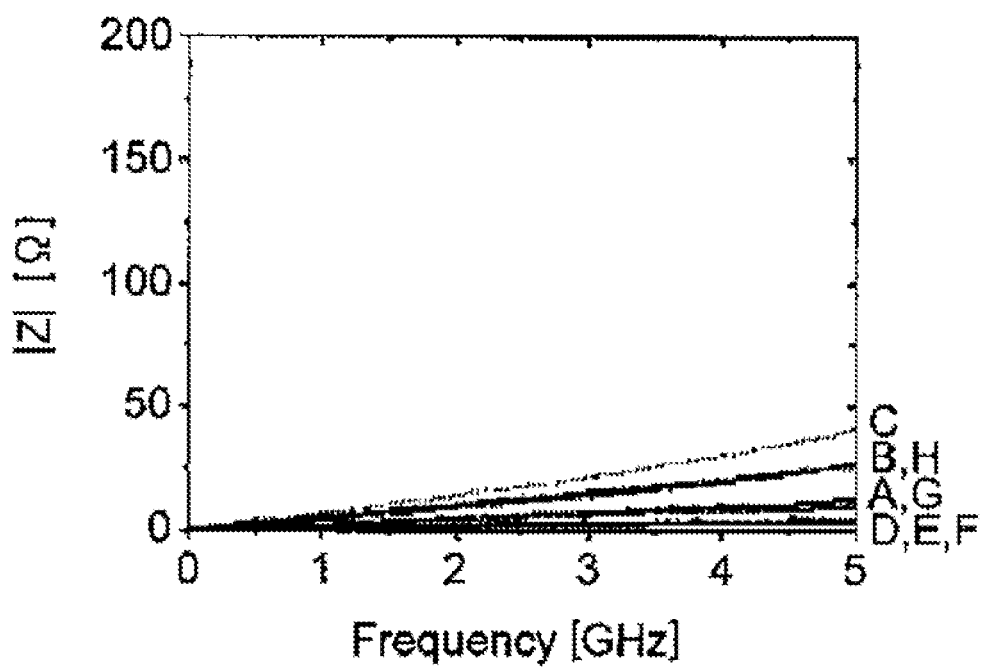
FIG. 22 is a graphical representation showing the power impedance characteristic in the power region A1 in Embodiment 2.
Figure 23:
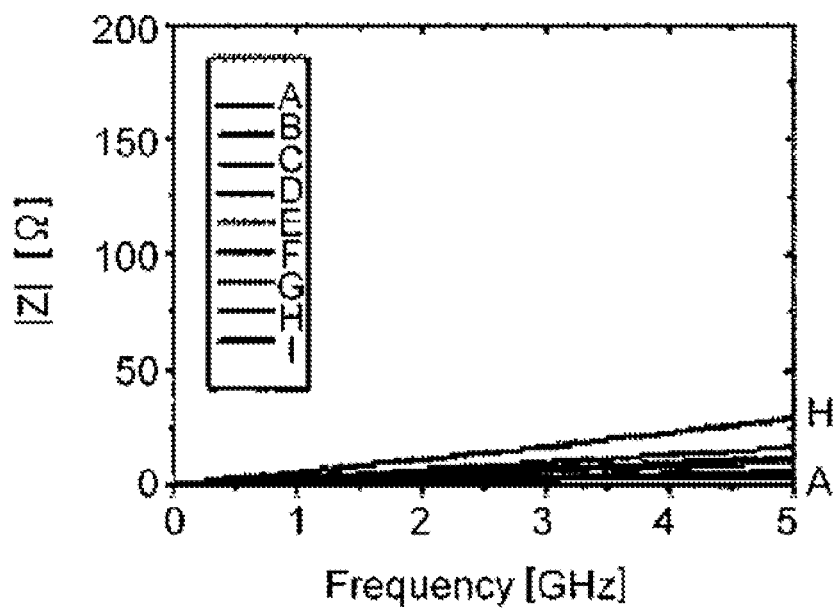
FIG. 23 is a graphical representation showing the power impedance characteristic in the power region A2 in Embodiment 2.
Figure 24:
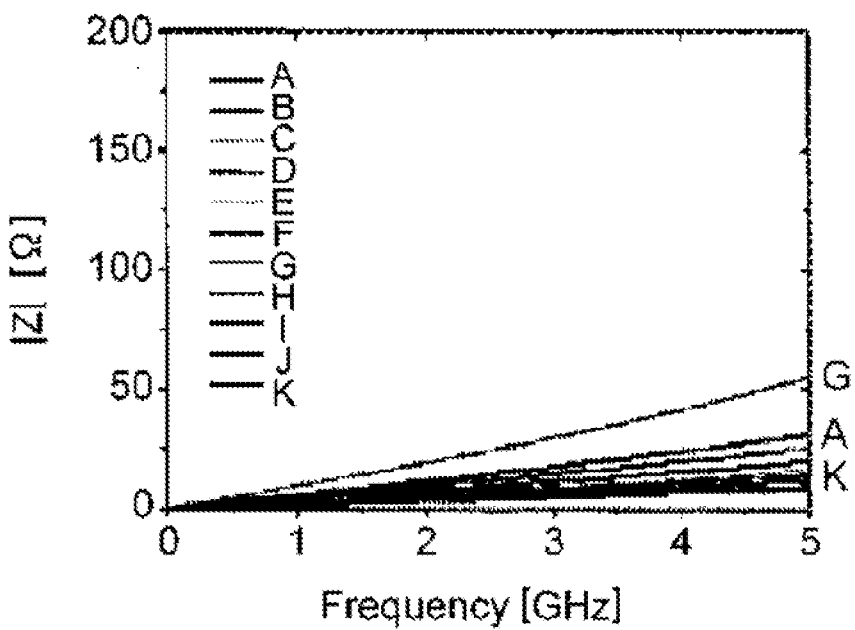
FIG. 24 is a graphical representation showing the power impedance characteristic in the power region A3 in Embodiment 2.
Figure 25:
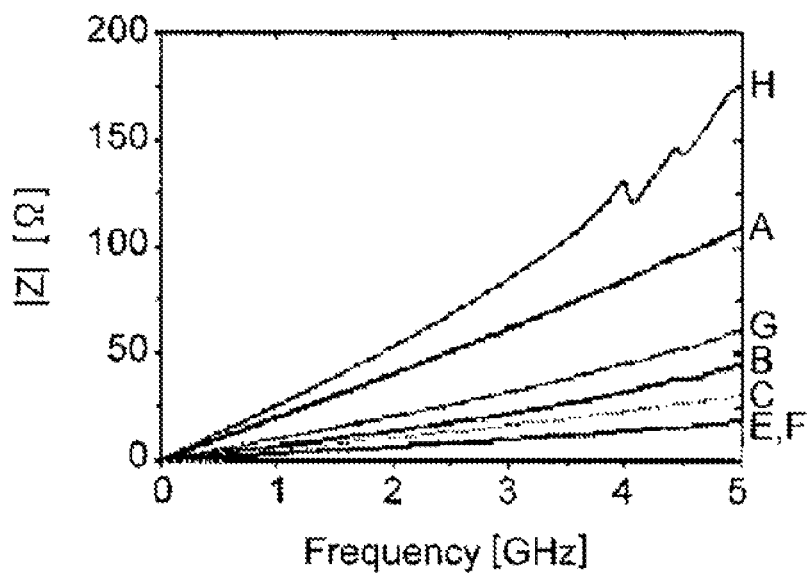
FIG. 25 is a graphical representation showing the power impedance characteristic in the power region A1 in Comparative Embodiment.
Figure 26:
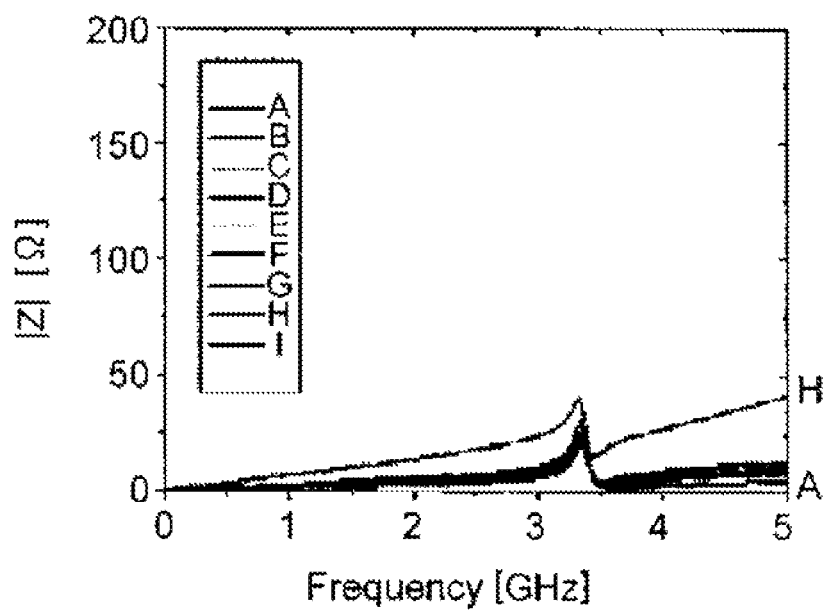
FIG. 26 is a graphical representation showing the power impedance characteristic in the power region A2 in Comparative Embodiment.
Figure 27:
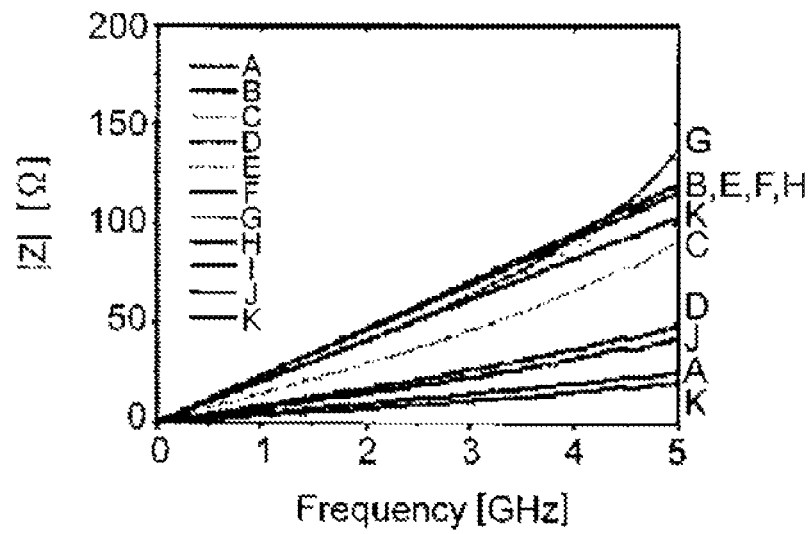
FIG. 27 is a graphical representation showing the power impedance characteristic in the power region A3 in Comparative Embodiment.
Figure 28:
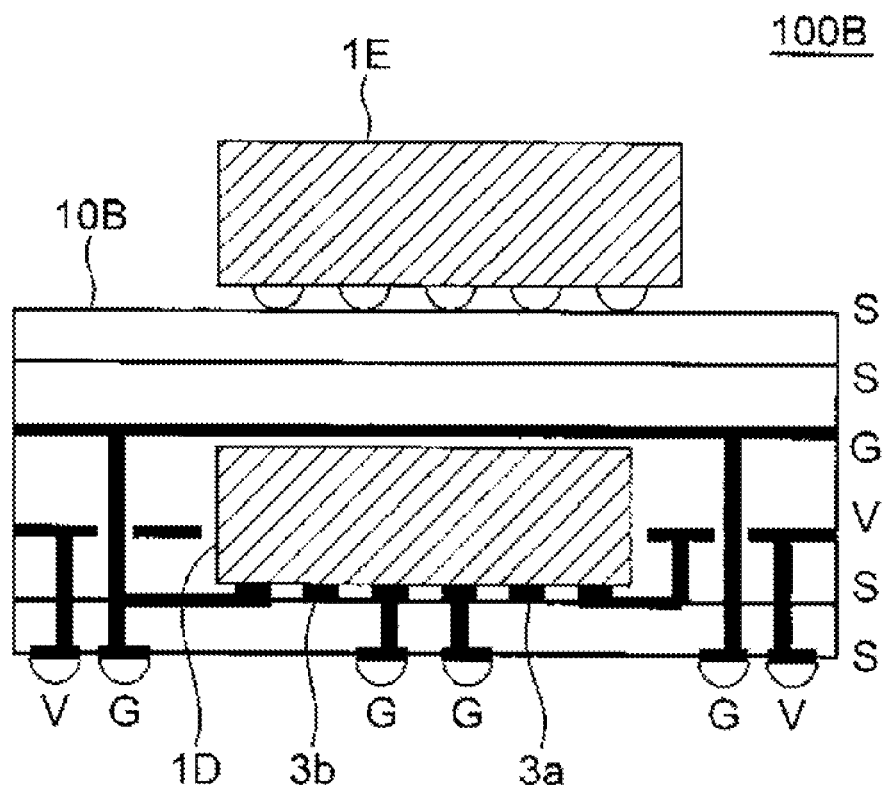
FIG. 28 is a cross-sectional view of a presumable semiconductor device using a printed wiring board described in patent literature.

FIGS. 22 to 24 show the power impedance characteristics in the power regions A1 to A3 in Embodiment 2, respectively. FIGS. 25 to 27 show the power impedance characteristics in the power regions in Comparative Embodiment corresponding to the power regions A1 to A3, respectively. In the figures, the frequency (GHz) is plotted on ordinate and the impedance (Ω) is plotted on abscissa. Here, the power impedance was calculated for 6 to 11 terminals indicated by A to K in each of the power regions A1 to A3.

The results show that the power impedance is much lower in Embodiment 2 than in Comparative Embodiment. This is presumably because the short vias and accordingly low via inductance contributes to low power impedance in Embodiment 2 consisting of only built-up layers while the thick core layer 16 and accordingly high inductance of vias through the core layer 16 contributes to high impedance in Comparative Embodiment consisting of a six-layer flip chip package. Also in the power regions A2 and A3, it is seen that the power impedance in Embodiment 2 is equal or improved compared with that in Comparative Embodiment.

The above results confirmed that the semiconductor device of Embodiment 2 ensures the manufacturing quality as a result of a smaller number of layers contributing to prevention of deterioration in electric characteristics. As described above, the assembly cost will be reduced as a result of a smaller number of assembly steps, the printed wiring board will be downsized as a result of a smaller number of layers, and the entire semiconductor device will accordingly be downsized, compared with the flip chip package.

The following modes are applicable to the semiconductor device of the present invention in addition to the above described basic structures. The semiconductor chip 1 has terminals arranged in a matrix on the circuit surface. The signal wire terminals 2 are arranged outside the power terminals 3a and ground terminals 3b. In such a case, the semiconductor chip has an area terminal having many pins with small pitches.

The power BGA pads 12 are arranged on diagonal lines and connected to each other by power wires. In such a case, the increase in power or ground impedance due to the absence of power plane can be reduced by assigning power terminals to the power BGA pads on diagonal lines and connecting them, for example, by thick wires.

In the first wiring layer L1, the bumps connected to connection terminals of a semiconductor chip or post lands 14 are smaller in diameter than the via lands 15a and 15b connected to the second and third wiring layers L2 and L3. Therefore, the power and ground terminals situated in the inner region of the area terminal can be connected to a ground plane formed in the second wiring layer L2 or to the power wires formed in the third wiring layer, which are located below.

The minimum pitch (L/S) of the first wiring layer is smaller than that of the second and third wiring layers. In such a case, the signal wires can be pulled out in the first wiring layer. By providing moderately fine wires in the second and third wiring layers, reduction in the yield due to fine wires can be prevented.

The printed wiring layer 20 further comprises, above the rear surface of the semiconductor chip 1B on which no terminal is formed, a fourth wiring layer for forming a ground plane and a fifth wiring layer for forming signal wires in sequence from the rear surface. In this way, the signal wires formed in the first wiring layer are interposed between the ground layers formed in the second and fourth wiring layers. The signal wires having the highest signal wire density have a continuous return current path secured either above or below them, ensuring the signal quality. Furthermore, the ground planes formed above and below serve to reduce crosstalk between highly dense wires.

The printed wiring board can further comprises a sixth wiring layer for forming signal wires farther away from the rear surface than the fifth wiring layer.

Another semiconductor chip 1C is further provided on the sixth wiring layer. In such a case, a continuous return current path can be secured for the other semiconductor device. Furthermore, for example, when a different semiconductor chip is a memory and the semiconductor chip embedded in the printed wiring board is a CPU, a signal processing unit consisting of the memory and CPU can be produced.

The bumps or lands for signal wires are arranged in a zigzag pattern in the first wiring layer, whereby a higher wire density can be obtained.

In the first wiring layer, two adjacent bumps or lands for signal wires can be placed on either side of a via land connected to the second wiring layer or to the third wiring layer.

The present invention is specified and described using exemplary embodiments. The present invention is not restricted to these embodiments and their modifications. As apparent to a person of ordinary skill in the field, various modifications can be made to the present invention without departing from the spirit and scope of the present invention defined in the attached claims.

The present invention claims the benefit of Japanese Patent Application No. 2007-266980, filed on Oct. 12, 2007, the entire disclosure of which is incorporated by reference herein.

The invention claimed is:

1. A semiconductor device comprising a semiconductor chip and a printed wiring board having a recess in which the semiconductor chip is housed face-down, wherein:

said printed wiring board comprises multiple wiring layers below a circuit surface of the semiconductor chip on which connection terminals are formed, and the multiple wiring layers include a first wiring layer for forming signal wires, a second wiring layer for forming a ground plane, and a third wiring layer for forming power wires and power BGA pads and ground BGA pads, the first wiring layer is disposed at a first height as measured from a surface of the semiconductor chip, the second wiring layer is disposed at a second height as measured from the surface of the semiconductor chip, and the third wiring layer is disposed at a third height as measured from the surface of the semiconductor chip, the first height being different from the second height and from the third height, the second height being different from the third height.

2. The semiconductor device according to claim 1 wherein terminals are arranged in a matrix on the circuit surface of said semiconductor chip and signal wire terminals are arranged outside power terminals and ground terminals.

3. The semiconductor device according to claim 1 wherein said power BGA pads are arranged on diagonal lines and connected to each other by said power wires.

4. The semiconductor device according to claim 1 wherein said first wiring layer includes first lands connected to the connection terminals of said semiconductor chip and second lands connected to the connection terminals of said semiconductor chip and said second or third wiring layer, and the diameters of the first lands are smaller than the diameters of the second lands.

5. The semiconductor device according to claim 4 wherein two adjacent first lands are provided on either side of said second land.

6. The semiconductor device according to claim 4 wherein at least some of said first lands are arranged in a zigzag pattern.

7. The semiconductor device according to claim 1 wherein the minimum pitch of said first wiring layer is smaller than the minimum pitch of said second and third wiring layers.

8. The semiconductor device according to claim 1 wherein said printed wiring board further has multiple other wiring layers above a rear surface of said semiconductor chip on which no connection terminal is formed and the multiple other wiring layers include a fourth wiring layer for forming a ground plane and a fifth wiring layer for forming signal wires in sequence from the rear surface.

9. The semiconductor device according to claim 8 wherein said multiple other wiring layers further include a sixth wiring layer for forming signal wires farther away from said rear surface than said fifth wiring layer.

10. The semiconductor device according to claim 9 further comprising another semiconductor chip above said sixth wiring layer.

11. A method for designing the semiconductor device according to claim 1 wherein the number of wires running between two adjacent bumps or lands in said first wiring layer and the connection terminal pitch of said semiconductor chip are determined based on the diameter of bumps or lands connected to said semiconductor chip, diameter of bumps or lands connected to said second or third wiring layer, minimum pitch of said first wiring layer, and minimum pitch of said second and third wiring layers.

* * * * *